(12) United States Patent
Rondon et al.

(10) Patent No.: US 11,791,191 B2
(45) Date of Patent: Oct. 17, 2023

(54) ULTRAVIOLET RADIATION SHIELD LAYER

(71) Applicant: RAYTHEON COMPANY, Waltham, MA (US)

(72) Inventors: Michael J. Rondon, Santa Rosa, CA (US); Shannon F. Wilkey, Lompoc, CA (US); Michael V. Liguori, Buellton, CA (US)

(73) Assignee: RAYTHEON COMPANY, Waltham, MA (US)

( * ) Notice: Subject to any disclaimer, the term of this patent is extended or adjusted under 35 U.S.C. 154(b) by 153 days.

(21) Appl. No.: 17/315,561

(22) Filed: May 10, 2021

(65) Prior Publication Data

US 2022/0013399 A1    Jan. 13, 2022

Related U.S. Application Data

(60) Provisional application No. 63/049,290, filed on Jul. 8, 2020.

(51) Int. Cl.

| | | |
|---|---|---|
| *H01L 21/683* | (2006.01) | |
| *B32B 7/12* | (2006.01) | |
| *C23C 14/10* | (2006.01) | |
| *C23C 14/14* | (2006.01) | |

(52) U.S. Cl.
CPC ............ *H01L 21/6835* (2013.01); *B32B 7/12* (2013.01); *C23C 14/10* (2013.01); *C23C 14/14* (2013.01); *B32B 2255/20* (2013.01)

(58) Field of Classification Search
CPC ... B32B 2255/20; B32B 7/12; H01L 21/6835; H01L 2221/6835; H01L 2221/68318; C23C 14/14
See application file for complete search history.

(56) References Cited

U.S. PATENT DOCUMENTS

| | | |
|---|---|---|
| 6,627,536 B1 | 9/2003 | Gabriel |
| 7,335,610 B2 | 2/2008 | Luoh et al. |
| 8,771,442 B2 | 7/2014 | Hong et al. |
| 2004/0159391 A1* | 8/2004 | Yamaguchi ............... C09J 5/06 156/379.8 |
| 2015/0035173 A1 | 2/2015 | Dang et al. |
| 2017/0154800 A1 | 6/2017 | Garant et al. |
| 2017/0170048 A1 | 6/2017 | Tran-Quinn et al. |
| 2019/0287854 A1 | 9/2019 | Miller et al. |

OTHER PUBLICATIONS

International Search Report and Written Opinion for PCT Application No. PCT/US2021/040305, Application Filing Date Jul. 2, 2021; dated Oct. 20, 2021 (12 pages).

* cited by examiner

*Primary Examiner* — Jaehwan Oh
(74) *Attorney, Agent, or Firm* — CANTOR COLBURN LLP

(57) ABSTRACT

A method is provided to fabricate a wafer including a bonding layer interposed between a device wafer and a handle wafer. The method includes performing a first deposition process to deposit an ultraviolet (UV) shield layer on a backside surface of the handle wafer. A second deposition process is performed to deposit a stress compensation layer on an exposed surface of the UV shield layer. The UV shield layer blocks UV energy generated while performing the second deposition process from reaching the bonding layer.

20 Claims, 3 Drawing Sheets

ULTRAVIOLET RADIATION SHIELD LAYER

CROSS-REFERENCE TO RELATED APPLICATIONS

This application claims priority to U.S. Provisional Application Ser. No. 63/049,290, filed Jul. 8, 2020, the contents of which are incorporated by reference herein in its entirety.

BACKGROUND

The present disclosure generally relates to semiconductor device and integrated circuits (ICs), and more specifically, to fabrication of semiconductor devices and ICs.

A temporary handle wafer is commonly employed during semiconductor device and/or IC fabrication processes. The temporary handle wafer is typically bonded to the device wafer to increase structural durability of the target device while performing various fabrication processes. The temporary handle wafer is typically formed as a silicon wafer or a fused silica wafer, which is bonded to the backside of the device wafer. Once bonded, the target device is fabricated using various processes and tooling. The temporary handle is then typically removed following completion of the fabrication processes.

Bonding the temporary handle wafer to the device wafer typically involves various processes including dispensing an adhesive onto the handle wafer, mechanically bonding the device wafer to the adhesive on the handle wafer, and heating the adhesive to solidify the bond. Heating the adhesive, however, can cause the bonded wafers to deform out of shape, e.g., bow, or form a concave/convex profile. The fabrication processes that are necessary after bonding the handle wafer typically require the wafer to be formed back into a substantially non-bowed shape.

In order to re-shape the wafer to remove the bowed profile, a stress compensation layer of silicon oxide ($SiO_2$) can be formed onto the backside of the temporary handle. As deposited stress compensation layer increases in thickness, the wafer begins to flex back into a non-bowed shape. Once the wafer reaches a substantially flat shape, the fabrication processes can be performed to complete the semiconductor device or IC.

SUMMARY

According to a non-limiting embodiment, a method is provided to fabricate a wafer including a bonding layer interposed between a device wafer and a handle wafer. The method includes performing a first deposition process to deposit an ultraviolet (UV) shield layer on a backside surface of the handle wafer. A second deposition process is performed to deposit a stress compensation layer on an exposed surface of the UV shield layer. The UV shield layer blocks UV energy generated while performing the second deposition process from reaching the bonding layer.

According to another non-limiting embodiment, a method of fabricating a wafer is provided. The method comprises performing a first deposition process on a wafer stack, the wafer stack including a bonding layer interposed between a device wafer and a handle wafer. The method further comprises depositing an ultraviolet (UV) shield layer on a backside surface of the handle wafer according to the first deposition process. The method further comprises performing a second deposition process on the wafer stack to deposit a stress compensation layer on an exposed surface of the UV shield layer, blocking UV energy generated from reaching the bonding layer using the UV shield layer while depositing the stress compensation layer, and flexing the wafer stack in response to depositing the stress compensation layer.

According to yet another non-limiting embodiment, a semiconductor device comprises a wafer stack that includes a bonding layer interposed between a device wafer and a handle wafer. An ultraviolet (UV) shield layer is on a backside surface of the handle wafer and a stress compensation layer is on an exposed surface of the UV shield layer. The UV shield layer is configured to block UV energy from reaching the bonding layer Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the disclosure are apparent from the following detailed description taken in conjunction with the accompanying drawings in which:

Figure 1:
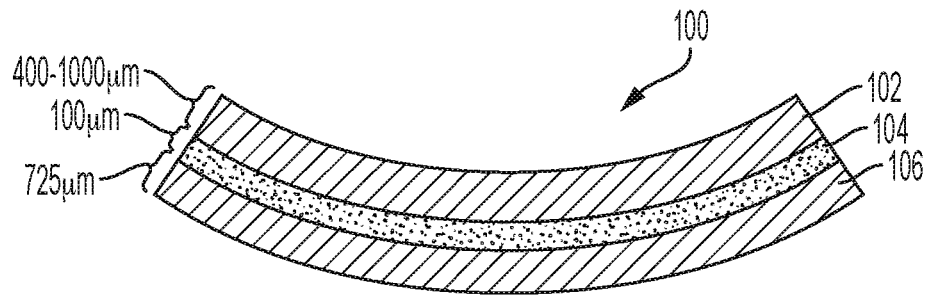
FIG. 1 depicts an intermediate wafer stack according to a non-limiting embodiment.

The diagrams depicted herein are illustrative. There can be many variations to the diagram or the operations described therein without departing from the spirit of the disclosure. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the present disclosure are described herein with reference to the related drawings. Alternative embodiments can be devised without departing from the scope of this disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present disclosure will now be provided. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor device or IC utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation.

The aforementioned doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the disclosure, a wafer stack may include a layer of adhesive disposed between a device wafer and a temporary handle wafer. This wafer package can be provided to a customer for further fabrication processing. However, the wafer package may be provided to the customer with slight deformations, e.g., a slight bowed profile, which may need to be removed before additional fabrication processes can continue.

One strategy to remove the deformation is to apply a stress compensation layer of silicon oxide ($SiO_2$), for example, onto the backside of the handle wafer using a physical vapor deposition (PVD) process. However, the temporary handle wafer is typically formed from a material transparent to ultraviolet (UV) radiation. As a result, UV energy that is present during the PVD process reaches the adhesive, thereby inadvertently causing the adhesive to cure and harden. At this stage, a high-force mechanical process such grinding and/or torqueing is required to subsequently remove the handle wafer and the adhesive, which can result in damaging the device wafer.

Turning now to an overview of the aspects of the disclosure, one or more non-limiting embodiments of the disclosure address the above-described shortcomings of the prior art by providing a UV shield layer prior to depositing the stress compensation layer. The UV shield layer comprises a material such as tantalum (Ta), for example, which is opaque to UV energy, and is configured to shield the adhesive layer from the UV energy present during the stress compression layer PVD process. In this manner, inadvertent curing of the adhesive layer can be prevented when depositing the stress compression layer, and the handle wafer and adhesive can be removed without causing damage to the device wafer.

With reference now to FIG. 1, an intermediate wafer stack 100 is illustrated following one or more processing operations according to one or more embodiments of the disclosure. In the present specification and claims, an "intermediate" wafer stack is defined as a wafer stack in a stage of fabrication prior to a final stage. The intermediate wafer stack 100 extends along a first axis (e.g., an X-axis) to define a horizontal length, a second axis (e.g., a Y-axis) orthogonal to the first axis to define a horizontal width, and a third axis (e.g., a Z-axis) orthogonal to the first and second axes to define a vertical height.

The intermediate wafer stack 100 includes a device wafer 102, a bonding layer 104, and a temporary handle wafer 106. In one or more embodiments of the disclosure, the intermediate wafer stack 100 is multi-layered and integrated therein can include one or more FEOL layers, MOL layers, and/or BEOL layers. The device wafer 102 comprises various materials including semiconductor materials such as silicon (Si), for example, dielectric materials such as silicon dioxide ($SiO_2$), for example, or a combination of both semiconductor materials and dielectric materials. In one or more non-limiting embodiments, the device wafer can have a thickness or height (e.g., extending along the Z-axis) ranging, for example, from about 400 µm to about 1000 µm.

The bonding layer 104 includes a temporary adhesive 104 configured to bond the handle wafer 106 to the device wafer 102. In one or more non-limiting embodiments, the adhesive includes an organic material adhesive capable of maintaining bonds at temperatures ranging, for example, from about 250 degrees Celsius (° C.) to about 300° C. The adhesive 104 can be applied to the backside surface of the device wafer 102 using a spin-coating process, and can have a thickness (e.g., extending along the Z-axis) ranging, for example, from about 90 µm to about 110 µm.

The handle wafer 106 comprises a bulk material including, but not limited to, silicon (Si), and has a thickness or vertical height (e.g., extending along the Z-axis) ranging, for example, from about 700 µm to about 730 µm. The handle wafer 106 is disposed against the backside of the device wafer 102 such that the adhesive 104 is interposed therebetween. The adhesive 104 is then heated to a bonding temperature of about 200° C. for approximately 3 minutes so as to effectively bond the handle wafer 106 to the device wafer 102. Although the adhesive 104 is heated, it should be appreciated that at this stage it is not cured beyond its rated debonding properties and thus can be subsequently removed via a low-force mechanical debonding process or low-force laser debonding process.

Figure 2:
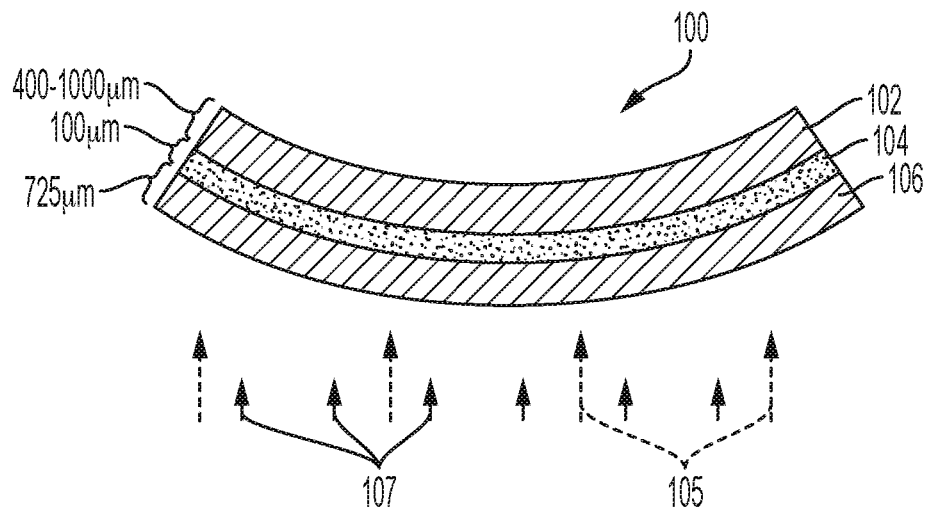
FIG. 2 depicts the wafer stack following initialization of a UV shield deposition process according to a non-limiting embodiment.

Turning now to FIG. 2, the wafer stack 100 is illustrated following initialization of a first material deposition process referred to herein as a UV shield deposition process. In one or more non-limiting embodiments, the UV shield deposition process includes a physical vapor deposition (PVD) process. The PVD process directs ultraviolet (UV) energy 105 in the form of a bombardment of electrons or electron beams to the backside surface of the handle wafer 106 to deliver UV shielding material 107 thereon. The UV shielding material 107 includes various types of materials that are opaque to UV energy and capable of ultimately blocking UV energy from reaching the bonding layer 104. In one or more non-limiting embodiments, the UV shielding material 107 comprises tantalum; however, the UV shield material is not limited thereto. For example, the UV shielding material 107 may be comprised of other UV blocking materials including, but not limited to, aluminum (Al), nickel (Ni), tin (Sn), copper (Cu), and titanium (Ti).

Figure 3:
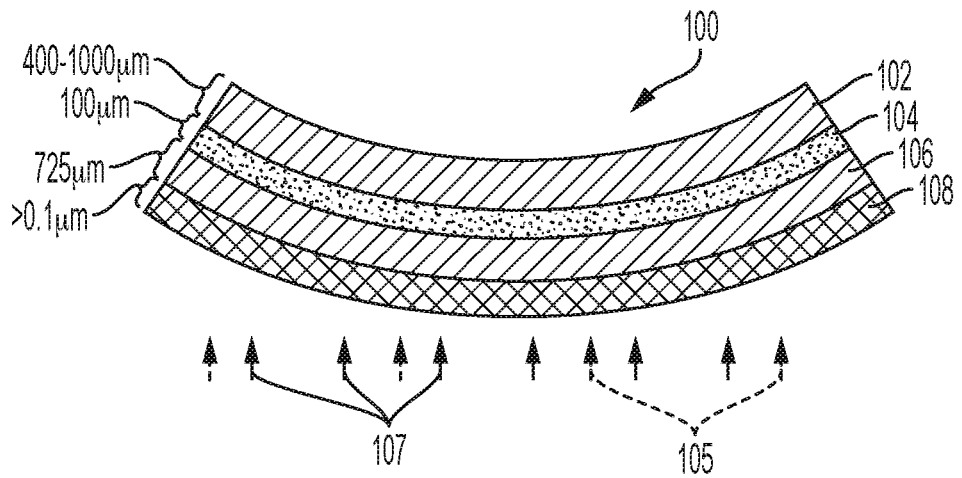
FIG. 3 depicts deposition of a UV shield layer on the wafer stack based on the UV shield deposition process according to a non-limiting embodiment.

Referring to FIG. 3, the wafer stack 100 is illustrated following deposition of a UV shield layer 108 based on the UV shield deposition process according to a non-limiting embodiment. In one or more embodiments, the UV shield layer 108 completely covers the backside of the handle wafer 106. As the time at which the PVD process is applied increases, the thickness of the UV shield layer 108 also increases. At a thickness of about 0.1 µm, the UV shield layer 108 begins inhibiting the UV energy produced by the PVD process from passing therethrough and the amount UV energy that reaches the bonding layer 104 begins to decrease. In one or more embodiments, the PVD process described above is applied until the UV shield layer 108 reaches a target thickness (e.g., extending along the Z-axis). In one or more embodiment, the target thickness ranges, for example, from about 1 µm to about 2 µm.

Figure 4:
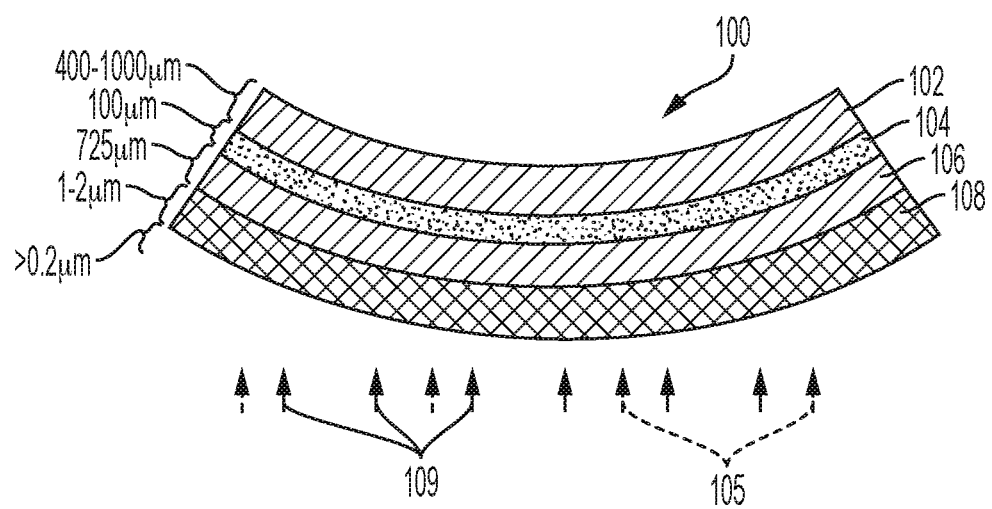
FIG. 4 depicts initialization of a stress compensation deposition process according to a non-limiting embodiment.

With reference to FIG. 4, the wafer stack 100 is illustrated following initialization of a second material deposition process referred to herein as a stress compensation deposition process. In one or more non-limiting embodiments, the stress compensation deposition process includes a physical vapor deposition (PVD) process. Similar to the process described above, the PVD process directs UV energy 105 in the form of a bombardment of electrons or electron beams to the backside surface of the UV shield layer 108. Unlike the UV shield deposition process, the UV energy 105 generated by the stress compensation deposition process delivers a stress compensation material 109. The stress compensation layer 109 includes a material that will apply an opposing stress on the wafer stack 100. In one or more non-limiting embodiments, the stress compensation material 109 comprises $SiO_2$. It should be appreciated, however, that other stress compensation materials can be employed including, but not limited to, silicon oxide (SiO), silicon nitride (SiN), silicon oxy-nitride ($SiO_xN_y$), aluminum nitride (AlN), tantalum nitride (TaN), or other oxide-based materials including a combination of those referenced above. While performing the stress compensation deposition process, the UV shield layer 108 blocks or substantially blocks the UV energy 105 from passing therethrough and reaching the bonding layer 104. In this manner, inadvertent or premature curing of the bonding layer 104, e.g., the adhesive 104, is prevented.

Figure 5:
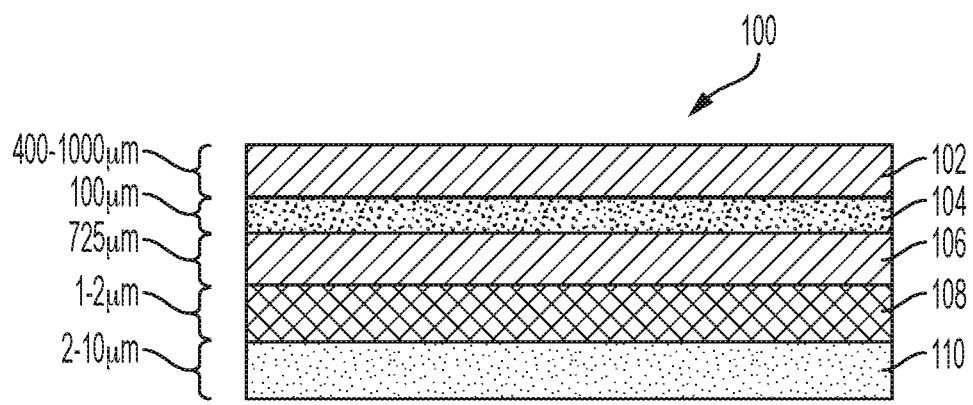
FIG. 5 depicts the wafer stack after completing deposition of a stress compensation layer on the UV shield layer according to a non-limiting embodiment.

Turning to FIG. 5, the wafer stack 100 is illustrated following deposition of a stress compensation layer 110 on the backside of the UV shield layer 108 based on the stress compensation deposition process according to a non-limiting embodiment. As mentioned above, the thickness of the stress compensation layer 110 increases as the duration of the PVD process increases. In one or more embodiments, the stress compensation layer 110 can be deposited to completely cover the exposed surface of the UV shield layer 108 and the PVD process described above can be applied until the stress compensation layer 110 reaches a target thickness (e.g., extending along the Z-axis) as shown in FIG. 5. The target thickness ranges, for example, from about 2 µm to about 12 µm. In one or more non-limiting embodiments, the target thickness is a thickness at which the wafer stack is strained into substantially straightened profile. The stress compensation layer 110 can be continuously deposited and its thickness increased until the wafer stack is substantially straitened.

Still referring to FIG. 5, the wafer stack 100 is shown substantially straitened of flat. The wafer stack 100 straightened in response to depositing the stress compensation layer 110. As mentioned above, the stress compensation layer 109 includes a material that applies an opposing stress on the wafer stack 100. As the stress compensation layer 109 is deposited on the UV shield layer and increases in thickness, the opposing stress strains and flexes the wafer stack 100 to remove the deformation or bowed profile. In one or more embodiments, flatness of the wafer stack 100 after straining the wafer stack 100 into a straightened profile to remove the bowed deformation is determined by methods that include, but are not limited to, visual inspection, drop-gauge measurement, capacitance-scanning wafer mapping, and straight-edge standard profile matching.

As described above, the bonding layer 104, e.g., the adhesive 104, is not cured at this stage because the UV shield layer 108 blocks or substantially blocks the UV energy 105 from passing therethrough and reaching the bonding layer 104 when forming the stress compensation layer 110. Accordingly, the handle layer 106 can be subsequently removed via a low-force mechanical debonding process or low-force laser debonding process without damaging the device wafer 102. In some embodiments, a cleaning process using a wet etchant, for example, can also be applied to further remove the bonding layer 104 without damaging the device wafer.

Figure 6:
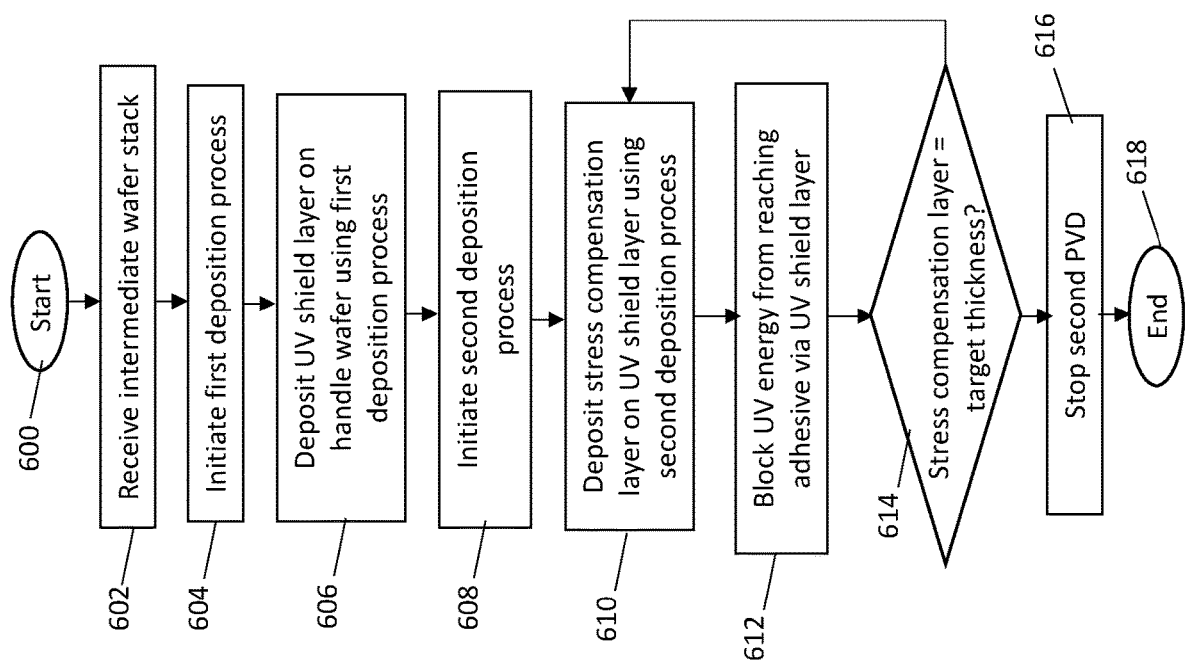
FIG. 6 is a flow diagram illustrating a method of forming a stress compensation layer on a wafer stack according to a non-limiting embodiment.

Referring now to FIG. 6, a flow diagram illustrates a method of forming a stress compensation layer on a wafer stack according to a non-limiting embodiment. The method begins at operation 600 and at operation 602 an intermediate wafer stack is received by a customer or provided to a one or fabrication tools to begin one or subsequent fabrication processes. The wafer stack includes a bonding layer interposed between a device wafer and a handle wafer. At operation 604, a first deposition process is initiated. The first deposition process includes, for example, a PVD process to deliver UV energy and a UV shielding material to the wafer stack. The UV shielding material includes, for example, a tantalum (Ta). At operation 606, a UV shield layer is formed on the backside of the handle wafer. When the UV shielding material comprises Ta, a layer of Ta is formed on the backside of the handle wafer which serves as the UV shield layer.

Turning to operation 608, a second deposition process is initiated. The second deposition process includes, for example, a PVD process to deliver UV energy and a stress compensation material to the UV shielding layer. The stress compensation material includes, for example, a silicon dioxide ($SiO_2$). At operation 610, a stress compensation layer is formed on the backside or facing surface of the UV shield layer while performing the second PVD process. At operation 612, the UV shield layer blocks UV energy generated during the second PVD process from reaching the bonding layer.

At operation 614, a determination is made as to whether a current thickness of the stress compensation layer deposited on the UV shield layer has reached a target thickness. When the current thickness of the stress compensation layer has not reached the target thickness, then the method returns to operation 610 and the second PVD process is continued. Accordingly, deposition of the stress compensation material continues so as to increase the thickness of the stress compensation layer. When, however, the current thickness of the stress compensation layer has reached the target thickness, the second PVD is stopped at operation 616 and the method ends at operation 618. In one or more non-limiting embodiments, the target thickness described in operation 614 is a thickness at which the wafer stack is strained into substantially straightened profile. Thus, although not illustrated, the method can also include an operation of continuing the second PVD process until determining the wafer stack is substantially straitened. As described herein, the flatness of the wafer stack 100 after straining the wafer stack 100 into a straightened profile to remove the bowed deformation is determined by methods that include, but are not limited to, visual inspection, drop-gauge measurement, capacitance-scanning wafer mapping, and straight-edge standard profile matching.

As described above, various non-limiting embodiments of the disclosure provide a UV shielding layer prior to depositing the stress compensation layer. The UV shield layer comprises a material such as tantalum (Ta), for example, which is opaque to UV energy, and is configured to shield the adhesive layer from the UV energy present during the stress compression layer PVD process. In this manner, inadvertent curing of the adhesive layer can be prevented when depositing the stress compression layer, and the handle wafer and adhesive can be removed without causing damage to the device wafer.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

Aspects of the present disclosure are described herein with reference to flowchart illustrations and/or block diagrams of methods, and apparatus (devices) products according to embodiments of the disclosure. The flowchart and block diagrams in the Figures illustrate the architecture, functionality, and operation of possible implementations of the device and method of fabricating the device according to various embodiments of the present disclosure. In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or a unique combination of fabrication operations to fabricate the semiconductor device.

The present disclosure may be a device and/or method of fabricating the device at any possible technical detail level of integration. The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a wafer, the method comprising:
   performing a first deposition process on a wafer stack, the wafer stack including a bonding layer interposed between a device wafer and a handle wafer;
   depositing an ultraviolet (UV) shield layer on a backside surface of the handle wafer according to the first deposition process; and
   performing a second deposition process on the wafer stack to deposit a stress compensation layer on an exposed surface of the UV shield layer,
   wherein the UV shield layer blocks UV energy generated while performing the second deposition process from reaching the bonding layer.

2. The method of claim 1, wherein the UV shield layer completely covers the backside surface of the handle wafer.

3. The method of claim 1, wherein the stress compensation layer completely covers the exposed surface of the UV shield layer.

4. The method of claim 1, wherein the first and second deposition processes each include a physical vapor deposition (PVD) process.

5. The method of claim 4, wherein the UV shield layer comprises tantalum (Ta).

6. The method of claim 5, wherein the UV shield layer has a thickness of at least 0.1 μm.

7. The method of claim 5, wherein the stress compensation layer comprises silicon dioxide ($SiO_2$).

8. The method of claim 7, wherein the bonding layer includes an adhesive comprising an organic material, the adhesive configured to maintain bonding at a temperature ranging from about 250 degrees Celsius (° C.) to about 300° C.

9. The method of claim 8, wherein the UV shield layer prevents the bonding layer from curing while depositing the stress compensation layer.

10. A method of fabricating a wafer, the method comprising:
    performing a first deposition process on a wafer stack, the wafer stack including a bonding layer interposed between a device wafer and a handle wafer;
    depositing an ultraviolet (UV) shield layer on a backside surface of the handle wafer according to the first deposition process;
    performing a second deposition process on the wafer stack to deposit a stress compensation layer on an exposed surface of the UV shield layer,
    blocking UV energy generated from reaching the bonding layer using the UV shield layer while depositing the stress compensation layer; and
    flexing the wafer stack in response to depositing the stress compensation layer.

11. The method of claim 10, wherein flexing the wafer stack includes flexing the wafer stack from a bowed profile to a substantially straight profile.

12. The method of claim 11, wherein blocking UV energy is performed simultaneously with flexing the wafer stack.

13. The method of claim 12, wherein the stress compensation layer applies a stress to the wafer stack so as to strain the wafer stack into the substantially straight profile.

14. The method of claim 10, wherein the UV shield layer completely covers the backside surface of the handle wafer.

15. The method of claim 10, wherein the stress compensation layer completely covers the exposed surface of the UV shield layer.

16. The method of claim 10, wherein the first and second deposition processes each include a physical vapor deposition (PVD) process.

17. The method of claim 16, wherein the UV shield layer comprises tantalum (Ta), and wherein the stress compensation layer comprises silicon dioxide ($SiO_2$).

18. The method of claim 10, wherein the bonding layer includes an adhesive comprising an organic material, and the UV shield layer prevents the adhesive from curing while depositing the stress compensation layer.

19. A semiconductor device comprising:
    a wafer stack including a bonding layer interposed between a device wafer and a handle wafer;
    an ultraviolet (UV) shield layer on a backside surface of the handle wafer; and
    a stress compensation layer on an exposed surface of the UV shield layer,
    wherein the UV shield layer is configured to block UV energy from reaching the bonding layer.

20. The semiconductor device of claim 19, wherein the UV shield layer comprises tantalum (Ta), and wherein the stress compensation layer comprises silicon dioxide ($SiO_2$).

* * * * *